United States Patent
Kim et al.

(10) Patent No.: US 7,977,204 B2
(45) Date of Patent: Jul. 12, 2011

(54) METHOD OF FORMING A FINE PATTERN OF A SEMICONDUCTOR DEVICE USING A DOUBLE PATTERNING TECHNIQUE

(75) Inventors: Yong-il Kim, Hwseong-si (KR);
Hyeong-sun Hong, Seongnam-si (KR);
Makoto Yoshida, Suwon-si (KR);
Bong-soo Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 45 days.

(21) Appl. No.: 12/485,970

(22) Filed: Jun. 17, 2009

(65) Prior Publication Data
US 2010/0151655 A1 Jun. 17, 2010

(30) Foreign Application Priority Data
Dec. 15, 2008 (KR) .................. 10-2008-0127264

(51) Int. Cl.
*H01L 21/76* (2006.01)
(52) U.S. Cl. ................ 438/424; 438/700; 257/E21.548; 257/E21.549; 257/E21.553
(58) Field of Classification Search .......... 438/424–439, 438/689–696; 257/E21.548, E21.549, E21.553
See application file for complete search history.

(56) References Cited

U.S. PATENT DOCUMENTS

| 6,194,285 B1 * | 2/2001 | Lin et al. ................ 438/424 |
| 2008/0090419 A1 * | 4/2008 | Koh et al. ................ 438/696 |

FOREIGN PATENT DOCUMENTS

| KR | 100714305 B1 | 4/2007 |
| KR | 100825801 B1 | 4/2008 |
| KR | 1020080042263 A | 5/2008 |

* cited by examiner

*Primary Examiner* — Brook Kebede
(74) *Attorney, Agent, or Firm* — Volentine & Whitt, PLLC

(57) ABSTRACT

A method of forming a fine pattern of a semiconductor device uses a double patterning technique. A first mask pattern is formed on a first hard mask layer disposed on a substrate. A conformal buffer layer is formed over the first mask pattern. A second mask pattern is formed such that segments of the buffer layer are interposed between the first and second mask patterns, and each topographical feature of the second mask pattern is disposed between two adjacent ones of each respective pair of topographical features of the first mask pattern. A first hard mask pattern is formed by etching the first hard mask layer using the first mask pattern, the second mask pattern, and/or the buffer layer as an etch mask. A trench is formed by etching the substrate using the first hard mask pattern as an etch mask. An isolation layer, of a material that is different from that of first hard mask pattern, is formed in the trench.

16 Claims, 14 Drawing Sheets

METHOD OF FORMING A FINE PATTERN OF A SEMICONDUCTOR DEVICE USING A DOUBLE PATTERNING TECHNIQUE

BACKGROUND OF THE INVENTION

1. Field of the Invention

The present invention relates to the manufacturing of semiconductor devices. More particularly, the present invention relates to a method of forming a fine pattern of a semiconductor device using a double patterning technique, e.g., using two generally coplanar hard mask patterns.

2. Description of the Related Art

A highly integrated semiconductor device referred to as a nanoscale device is formed of patterns whose features have widths and pitches (critical dimensions) below the resolution limits of photolithography. One such pattern of a highly integrated semiconductor device is an isolation layer which is used to define active regions of the device. The isolation layer is formed by producing a trench/recess in a substrate and filling the trench/recess with an insulating material. However, it is difficult to fill the trench/recess adequately with insulating material when sections of the trench/recess are narrow and the pitch of the sections of the trench/recess is fine, i.e., it is difficult to form an isolation layer whose critical dimensions are on the order of nanometers.

SUMMARY OF THE INVENTION

An object of the present invention it to provide a method of forming a pattern of a semiconductor device, whose topographic features are narrower and have a pitch smaller than that which can be formed using photolithography alone, i.e., an object of the present invention is to provide a method of forming a pattern not limited by the resolution of photolithography processes.

Another object of the present invention is to provide a method of forming a trench isolation layer for defining an active region, and by which the layer has excellent gap-filling characteristics.

Still another object of the present invention is to provide a relatively simple method of forming a fine pattern of a semiconductor device.

Still another object of the present invention is to provide a method of forming a trench isolation layer for defining an active region, which ensures that the isolation layer is not damaged when an etch mask used in the method is removed.

According to an aspect of the present invention, there is provided a method of forming a pattern of a semiconductor device in which a double patterning technique is used. A first hard mask layer is formed on a substrate, and a first mask pattern is formed on the first hard mask layer. Then, a buffer layer is formed over both sidewalls of each topographical feature of the first mask pattern. Next, a second mask pattern is formed adjacent to the first mask pattern with segments of the buffer layer interposed therebetween. In this respect, each topographical feature of the second mask pattern is interposed between adjacent ones of each respective pair of the topographical features of the first mask pattern. A first hard mask pattern which exposed portions of the substrate is then formed by etching the first hard mask layer using an etch mask selected from the group comprising the first mask pattern, the second mask pattern, and the buffer layer. A trench is formed in the substrate by etching the exposed portions of the substrate using the first hard mask pattern as an etch mask, and an isolation layer is formed in the trench. The isolation layer formed of an insulating material that is different in composition from that of the first hard mask pattern.

The first mask pattern and the second mask pattern may be formed of the same material as that of the first hard mask layer.

The first hard mask pattern may be formed by etching the first hard mask layer using the first mask pattern and the second mask patterns together as an etch mask. The first hard mask pattern may be formed by etching the first hard mask layer using the buffer layer as an etch mask.

The method may also include removing selected portions of the first mask pattern and the second mask pattern to form a trimmed first mask pattern and a trimmed second mask pattern, respectively, before the first hard mask pattern is formed. In this case, the first hard mask pattern is formed by etching the first hard mask layer using the trimmed first mask pattern and the trimmed second mask pattern together as an etch mask.

The method may include removing selected portions of the buffer layer to form a trimmed buffer layer, after the second mask pattern is formed but before the first hard mask pattern is formed. In this case, the first hard mask patterns is formed by etching the first hard mask layer using the trimmed buffer layer as an etch mask.

The method may also include forming a second hard mask layer before the first mask pattern is formed. In this case, the second hard mask layer is formed of a material different from that of the first hard mask layer. Also, recesses may be formed in a top surface of the second hard mask layer between the topographical features of the first mask patterns. In this case, the buffer layer may be formed in such a manner that a conformal segment of the buffer layer covers both opposite sidewalls of two adjacent topographical features of the first mask pattern and a lower surface of the second hard mask layer which delimits the bottom of the recess between the opposite sidewalls of the two adjacent topographical features of the first mask patterns.

BRIEF DESCRIPTION OF THE DRAWINGS

These and other features, objects and advantages of the present invention will be more clearly understood from the following detailed description of the preferred embodiments thereof made in conjunction with the accompanying drawings in which.

DETAILED DESCRIPTION OF THE PREFERRED EMBODIMENTS

Figure 1:
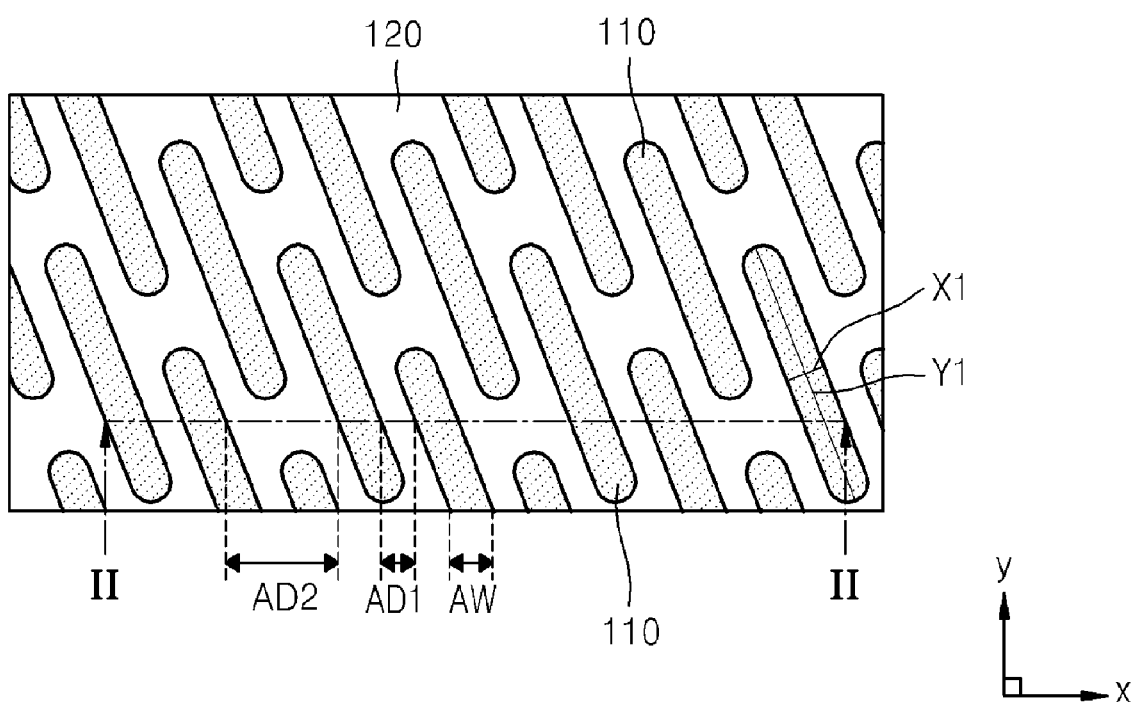
FIG. 1 is a layout of active regions that can be realized by a method of forming a pattern of a semiconductor device according to the present invention.

The present invention will now be described more fully with reference to the accompanying drawings. Like reference numerals are used to designate like elements throughout the drawings. Also, in the drawings, the thicknesses and widths of layers and regions are exaggerated for clarity. Furthermore, various features and regions in the drawings are illustrated schematically. Accordingly, the present invention is not limited by the relative sizes of or distances between features/ regions shown in the attached drawings. Finally, it is to be noted that the term "features" as used throughout the specification refers to topographic features which are repeated periodically in a layer of the device, i.e., which together constitute a particular pattern.

Referring to FIG. 1, a plurality of active regions 110 of a semiconductor device are defined by an isolation layer 120. Each of the active regions 110 is in the form of an island having a short axis X1 and a long axis Y1 which intersect each other at a right angle. The short axis X1 and the long axis Y1 may respectively extend in directions that are parallel or oblique to the x-axis and the y-axis of FIG. 1. A process of forming the active regions 110 on a substrate 200 will be explained with reference to FIGS. 2A through 2Q.

Figure 2A:
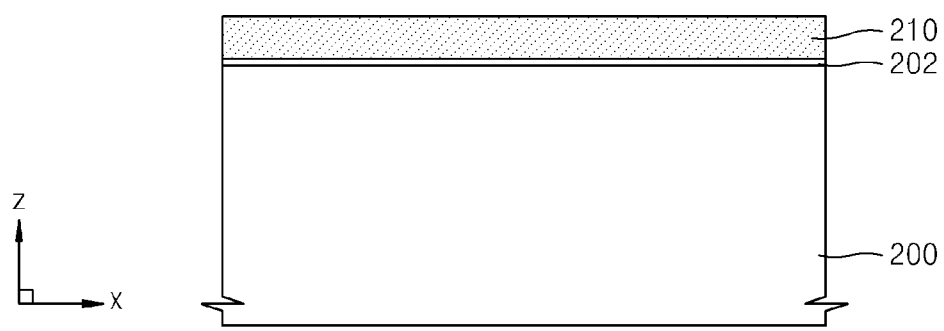
FIGS. 2A through 2Q are cross-sectional views taken along line II-II' of FIG. 1, illustrating one embodiment of a method of forming a pattern of a semiconductor device according to the present invention.

Referring to FIG. 2A, a pad oxide layer 202 is formed on the substrate 200. A first hard mask layer 210 is formed on the pad oxide layer 202. The substrate 200 may be a general semiconductor substrate such as a silicon substrate.

The first hard mask layer 210 is used as an etch mask when the substrate 200 is etched in order to define the active regions 110. If the substrate 200 is a silicon substrate, the first hard mask layer 210 may be a polysilicon layer. The first hard mask layer 210 may be formed to a thickness of about 300 Å to about 1000 Å.

Figure 2B:
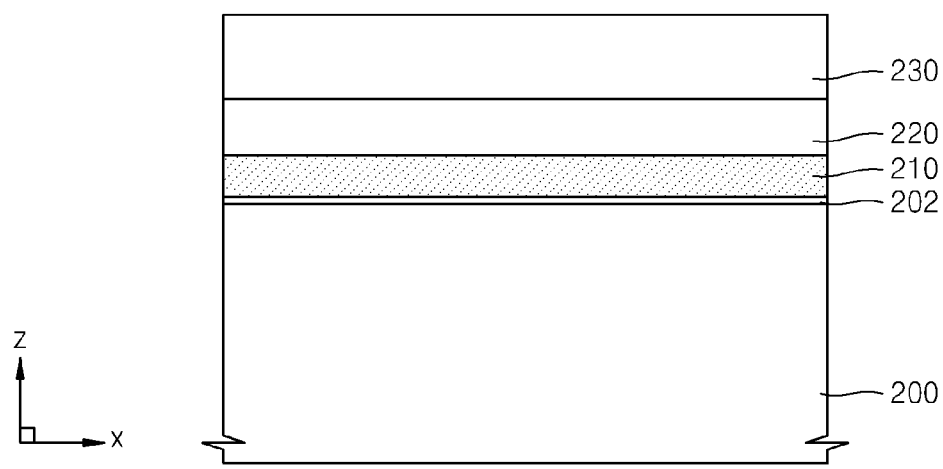

Referring to FIG. 2B, a second hard mask layer 220 and a first mask layer 230 are sequentially formed on the first hard mask layer 210. If the first hard mask layer 210 is a polysilicon layer, the second hard mask layer 220 may be a silicon oxide layer. For example, the second hard mask layer 220 may be a medium temperature oxide (MTO) layer having a thickness of about 300 Å to about 600 Å. The first mask layer 230 may be a polysilicon layer.

Figure 2C:
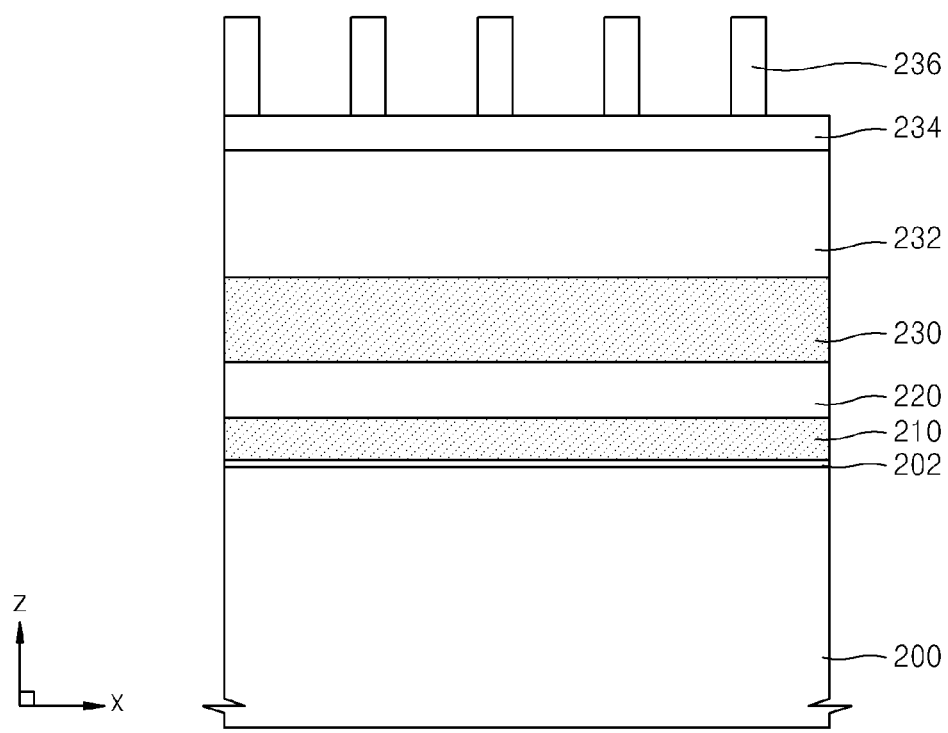

Referring to FIG. 2C, a third hard mask layer 232, an anti-reflection layer 234, and a photoresist pattern 236, which are necessary to pattern the first mask layer 230 using photolithography, are sequentially formed on the first mask layer 230. The third hard mask layer 232 may be an amorphous carbon layer (ACL). The anti-reflection layer 234 may be a layer of SiON. The photoresist pattern 236 and more particularly, the features which constitute the photoresist pattern 236, may have a pitch greater than the pitch of the fine pattern that is to be formed on the substrate 200.

Figure 2D:
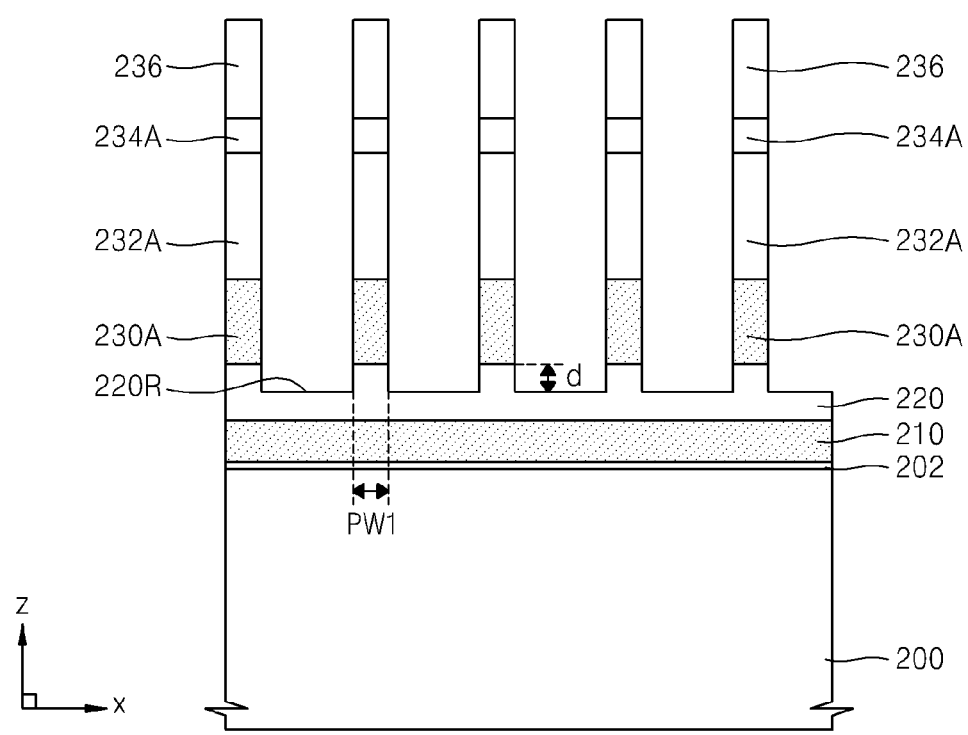

Referring to FIG. 2D, an anti-reflection layer pattern 234A and a third hard mask pattern 232A are formed by sequentially etching the anti-reflection layer 234 and the third hard mask layer 232 using the photoresist pattern 236 as an etch mask. Next, a first mask pattern 230A is formed by etching the first mask layer 230 using the third hard mask pattern 232A as an etch mask. Also, at this time, recessed portions 220R of the second hard mask layer 220 may be formed by etching parts of the second hard mask layer 220, which are exposed between the features of the first mask pattern 230A, to a depth "d".

Each of the features of the first mask pattern 230A may have a linear shape that extends in a direction parallel to the long axis Y1 of each of the active regions 110 (FIG. 1). The features of the first mask pattern 230A may be repeatedly formed on the substrate 200 at a first pitch P. The width PW1 of each of the features of the first mask pattern 230A in the x-axis direction may be equal to the width AW of each of the active regions 110 (FIG. 1) in the x-axis direction.

By the time the third hard mask pattern 232A is formed, part of the photoresist pattern 236 may be consumed.

Figure 2E:
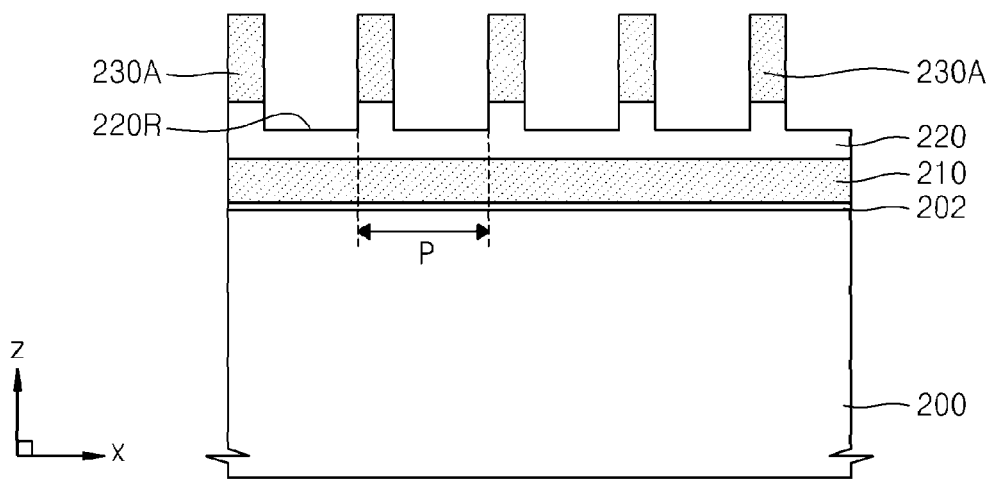

Referring to FIG. 2E, top surfaces of the features of the first mask pattern 230A are exposed by removing the third hard mask pattern 232A, the anti-reflection layer pattern 234A, and the photoresist pattern 236. In this respect, the third hard mask pattern 232A, the anti-reflection layer pattern 234A, and the photoresist pattern 236 may be removed by ashing and stripping.

Figure 2F:
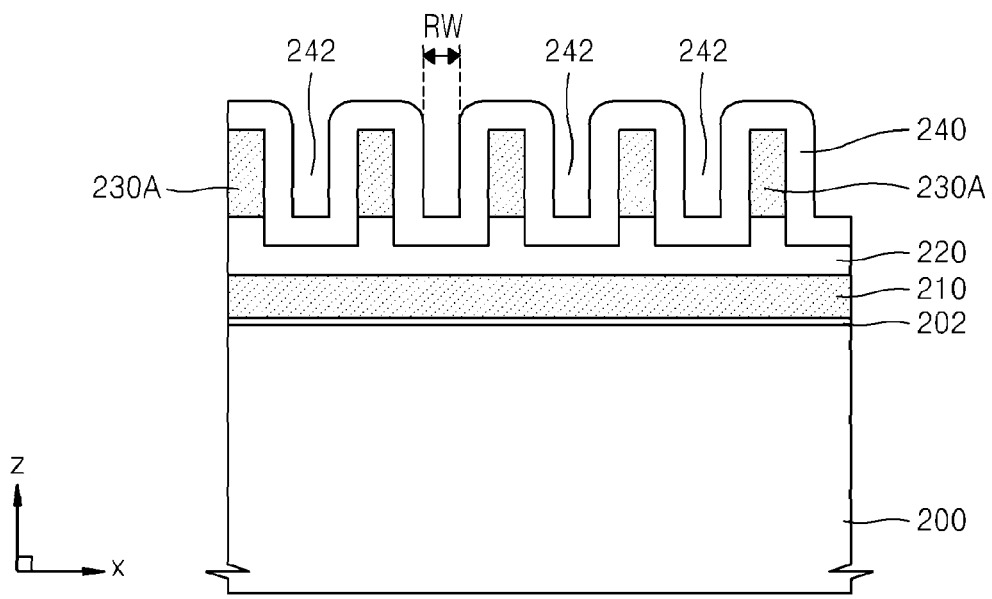

Referring to FIG. 2F, a conformal buffer layer 240 is formed over the exposed surfaces of the first mask pattern 230A and the recessed portions 220R of the second hard mask layer 220. The buffer layer 240 may be an oxide layer or a nitride layer formed by atomic layer deposition (ALD). In any case, as a result, recesses 242 are formed at the top surface of the buffer layer 240 in such a manner that each of the recesses 242 is disposed between each respective pair of adjacent features of the first mask pattern 230A. Due to the buffer layer 240, the features of a second mask pattern 250A (see FIG. 2H) that are to be formed in the recesses 242 can have the same widths and heights as the features of the first mask pattern 230A that are to be used as an etch mask in a subsequent process.

In this respect, the buffer layer 240 can uniformly cover top surfaces and sidewalls of the first mask pattern 230A and the recessed portions 220R of the second hard mask layer 220. For example, the thickness of the buffer layer 240 may be the same as the depth "d" (FIG. 2D). Also, the width RW of each of the recesses 242 in the x-axis direction may be equal to the width AW of each of the active regions 110 (FIG. 1) in the x-axis direction.

Furthermore, the buffer layer 240 is preferably formed of a material having etching characteristics similar to those of the material from which the second hard mask layer 220 is formed. That is, the buffer layer 240 may be formed of the same material as that used to form the second hard mask layer 220 or the buffer layer 240 may be formed of a material that is different from but has similar etching characteristics as the material from which the second hard mask layer 220 is formed. For example, each of the second hard mask layer 220 and the buffer layer 240 may be an oxide layer.

Figure 2G:
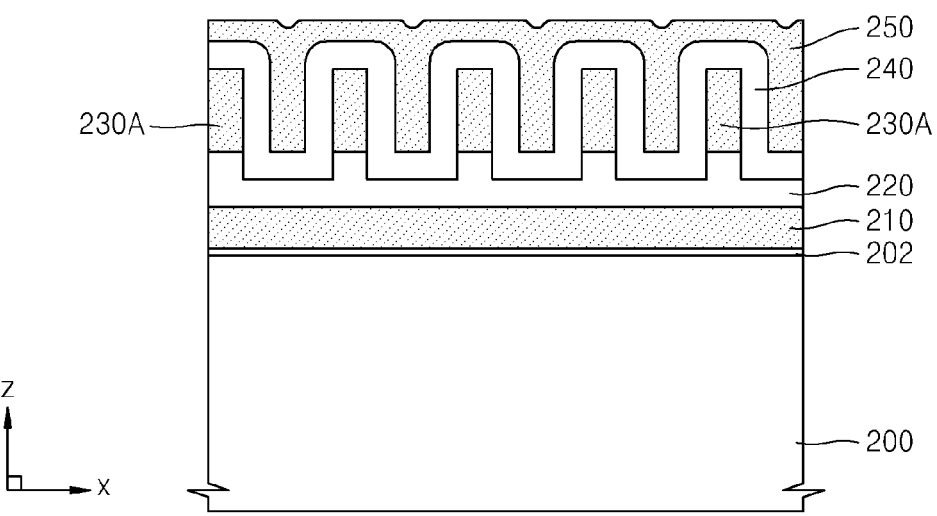

Referring to FIG. 2G, a second mask layer 250 is formed over the buffer layer 240 on the substrate 200 to such a thickness that the recesses 242 are filled by the second mask layer 250. The second mask layer 250 may be formed of the same material as that of the first mask layer 230. For example, the second mask layer 250 may be a polysilicon layer.

Figure 2H:
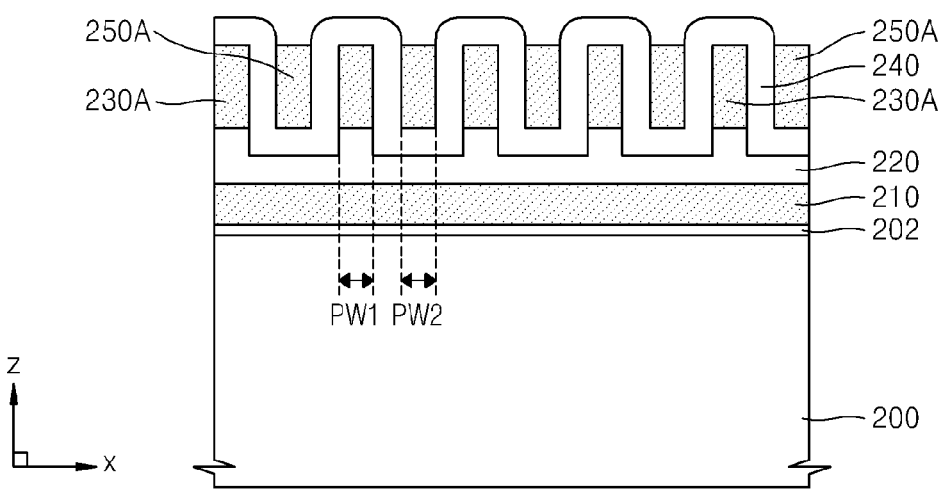

Referring to FIG. 2H, a second mask pattern 250A is formed in the recesses 242 by removing an upper portion of the second mask layer 250. More specifically, the second mask layer 250 is etched. For example, the second mask layer 250 is wet etched. As a result, those portions of the buffer layer 140 covering the first mask pattern 230A are exposed between respective features of the second mask pattern 250A formed by removing an upper portion of the second mask layer 250. The etch rate of the second mask layer 250 may be adjusted so that the upper surface of the resulting second mask pattern 250A is level with the upper surface of the first mask pattern 230A.

Each of the features of second mask pattern 250A may have a linear form that extends longitudinally in the same direction in which the features of the first mask pattern 230A extend longitudinally, e.g., parallel to the long axis Y1 of each of the active regions 110 (FIG. 1). The width PW2 of each of the features of the second mask pattern 250A in the x-axis direction may be equal to the width AW of each of the active regions 110 in the x-axis direction. Also, the features of the second mask pattern 250A may be substantially horizontally aligned with the features of the first mask pattern 230A. That is, the upper surfaces of the features of the second mask pattern 250A may lie within the same horizontal plane as the upper surfaces of the features of the first mask pattern 230A, and the lower surfaces of the features of the second mask pattern 250A may lie within the same horizontal plane as the lower surfaces of the features of the first mask pattern 230A.

Figure 2I:
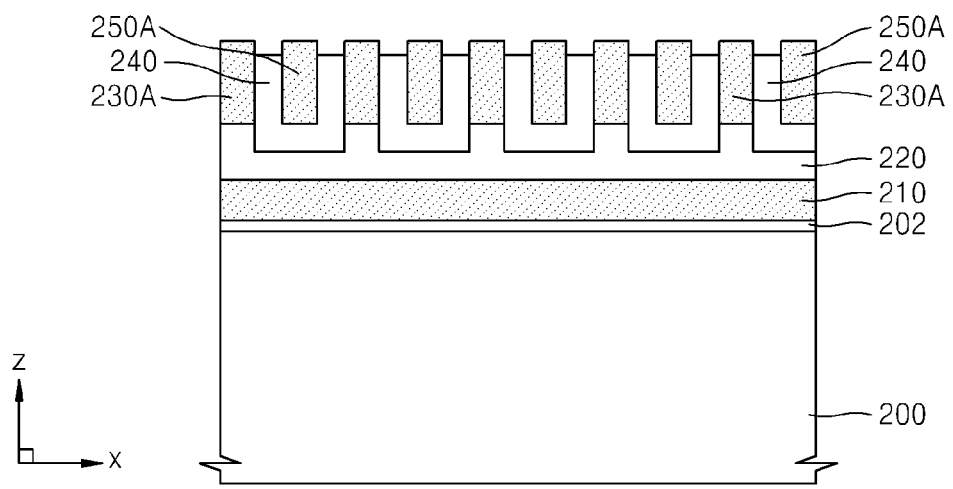

Referring to FIG. 2I, those portions of the buffer layer 240 which cover the first mask pattern 230A are removed to expose top surfaces of the features of the first mask pattern 230A For example, the buffer layer 240 is dry etched. If the buffer layer 240 is an oxide layer, the etching gas employed in the dry etching process may be CxFy (wherein each of x and y is an integer of 1 to 10), or a mixture of CxFy, $O_2$, and Ar. More specifically, the CxFy may be $C_4F_6$ or $C_4F_8$. Alternatively, the buffer layer 240 is wet etched. For example, if the buffer layer 240 is an oxide layer, an etchant containing fluorine (F), such as diluted HF (DHF), $NH_4F$, or a combination thereof, may be used in order to selectively wet etch the buffer layer 240. Again, an appropriate selection of materials ensures that the buffer layer 240 has a significantly greater etch rate than the etch rates of the first mask pattern 230A and the second mask pattern 250A.

In any case, both the top surfaces of the features of the first mask pattern 230A and the top surfaces of the features of the second mask pattern 250A are exposed on the substrate 200 as a result.

Note, though, the process described with reference to FIG. 2I may be omitted in certain circumstances.

Figure 2J:
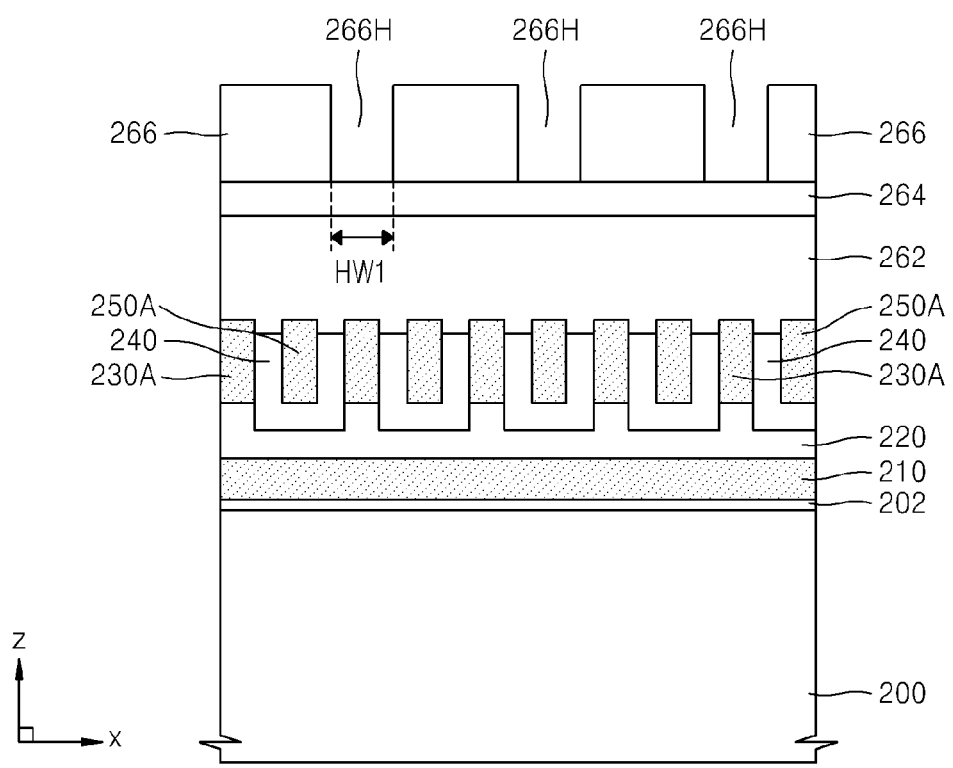

Referring to FIG. 2J, a fourth hard mask layer 262, an anti-reflection layer 264, and a photoresist pattern 266 are sequentially formed to cover the first mask pattern 230A, the second mask pattern 250A, and the remnants of the buffer layer 240. For example, the fourth hard mask layer 262 may be an ACL. The anti-reflection layer 264 may be formed of SiON.

The photoresist pattern 266 defines a plurality of openings 266H. The width HW1 of each of the openings 266H in the x-axis direction may be equal to or greater than the width PW1 of each of the features of the first mask pattern 230A in the x-axis direction. Alternatively, the width HW1 of each of the openings 266H in the x-axis direction is equal to or greater than the width PW2 of each of the features of the second mask pattern 250A in the x-axis direction.

Figure 2K:
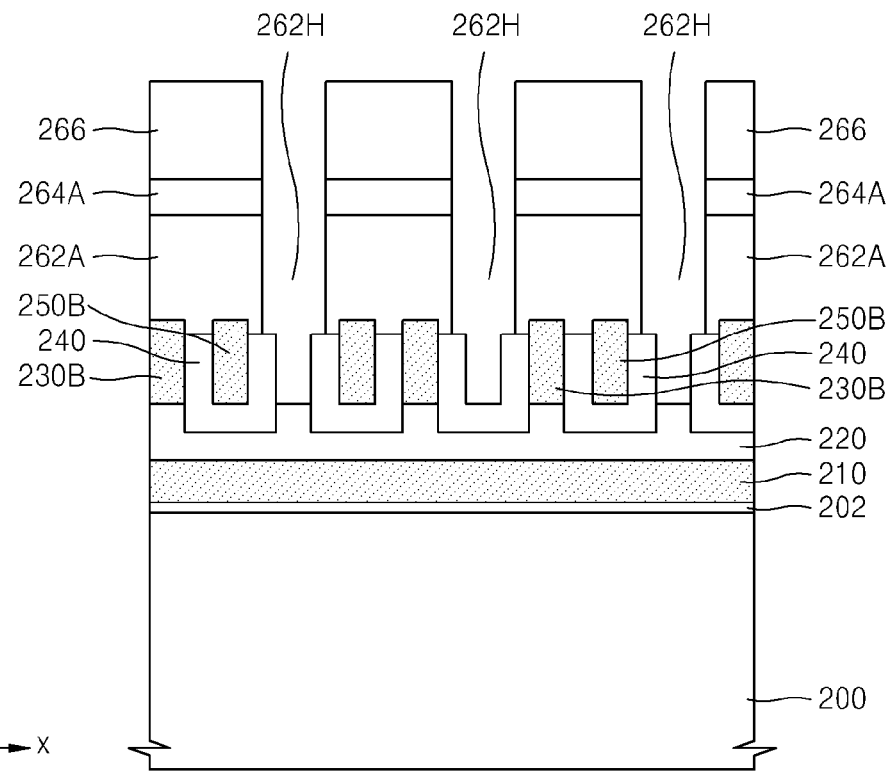

Referring to FIG. 2K, the anti-reflection layer 264 and the fourth hard mask layer 262 are sequentially etched, using the photoresist pattern 266 as an etch mask, to form an anti-reflection layer pattern 264A and a fourth hard mask pattern 262A. At this time, part of the photoresist pattern 266 may be consumed. In any case, and as a result, openings 262H are formed between the features of the fourth hard mask pattern 262A. The openings 262H expose respective features of the first mask pattern 230A and the second mask pattern 250A. The second hard mask layer 220 may also be exposed through the plurality of openings 262H. Furthermore, if the openings 262H are each wide enough, the remnants of the buffer layer 240 disposed around the exposed features of the first mask pattern 230A and the second mask pattern 250A can be exposed through the openings 262H.

Next, those features of the first mask pattern 230A and the second mask pattern 250A which are exposed through the openings 262H are etched away using the fourth hard mask pattern 262A and the remnants of the buffer layer 240 as an etch mask. As a result, a trimmed first mask pattern 230B and a trimmed second mask pattern 250B of features having shapes in the form of islands similar to those of the active regions 110 (FIG. 1) are obtained.

Figure 2L:
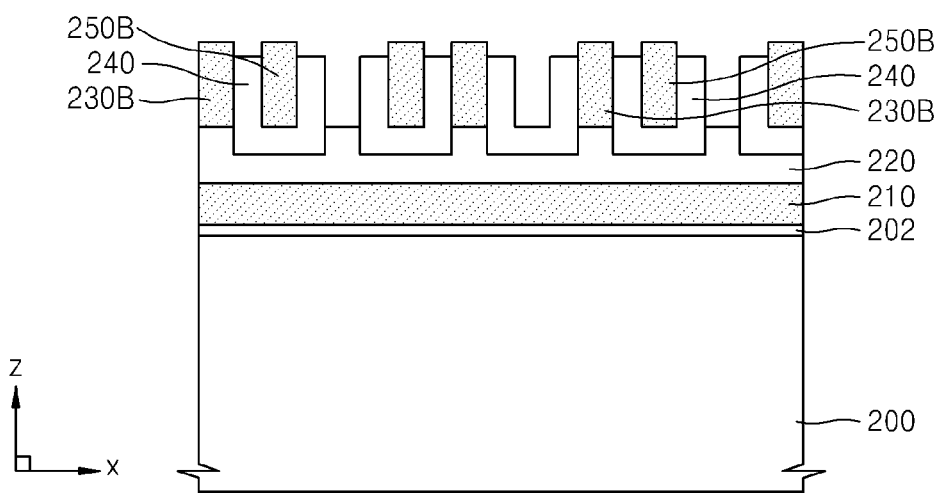

Referring to FIG. 2L, top surfaces of the trimmed first mask pattern 230B and the trimmed second mask pattern 250B are exposed by removing the fourth hard mask pattern 262A, the anti-reflection layer pattern 264A, and the photoresist pattern 266. In this respect, the fourth hard mask pattern 262A, the anti-reflection layer pattern 264A, and the photoresist pattern 266 may be removed by ashing and stripping.

Figure 2M:
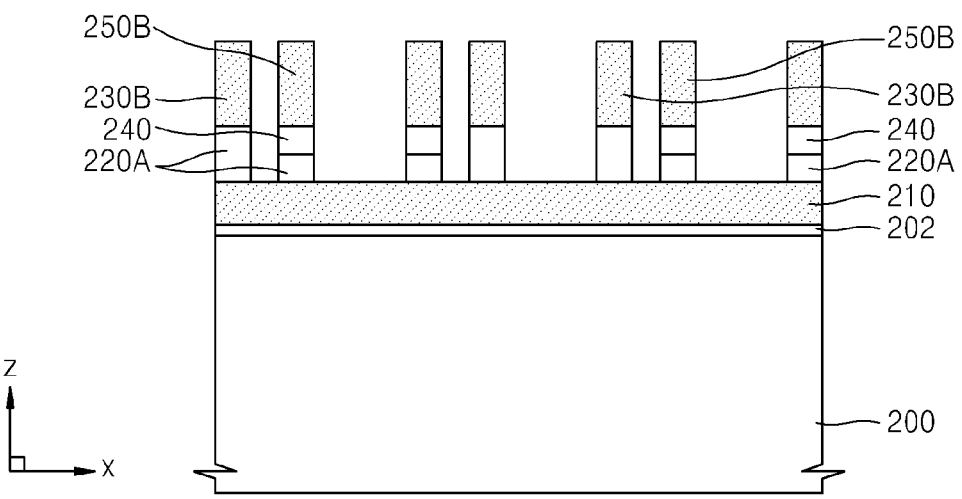

Referring to FIG. 2M, the remnants of the buffer layer 240 are anisotropically etched using the trimmed first mask pattern 230B and the trimmed second mask pattern 250B as an etch mask. As a result, the second hard mask layer 220 is exposed between the features of the trimmed first mask pattern 230B and the features of the trimmed second mask pattern 250B. The exposed portion of the second hard mask layer 220 is anisotropically dry etched to form a second hard mask pattern 220A which exposes the first hard mask layer 210.

If each of the second hard mask layer 220 and the buffer layer 240 is an oxide layer, the remnants of the buffer layer 240 and the second hard mask layer 220 can be dry etched at a rate higher than the trimmed first mask pattern 230B and the trimmed second mask pattern 250B which are formed of polysilicon, using a gas mixture of CxFy (wherein x is an integer of 1 to 6 and y is an integer of 3 to 8) and $O_2$. For example, $C_3F_8$, $C_4F_6$, $C_4F_8$, or $C_5F_8$ mixed with $O_2$ in a volumetric ratio of 1:1 may be used as an etching gas. If necessary, Ar may be added to the etching gas. Also, the dry etching may be performed in a plasma atmosphere that is obtained by exciting the etching gas.

If each of the second hard mask layer 220 and the buffer layer 240 is a nitride layer, the remnants of the buffer layer 240 and the second hard mask layer 220 can be dry etched at a higher rate than the trimmed first mask pattern 230B and the trimmed second mask pattern 250B which are formed of polysilicon, using CHxFy (wherein x and y are each an integer of 1 to 3 and x+y=4). For example, the etching gas can be $CH_2F_2$, $CH_3F$, or a mixture thereof. If necessary, $O_2$ may be added to the etching gas. Also, the dry etching may be performed in a plasma atmosphere that is obtained by exciting the etching gas.

Figure 2N:
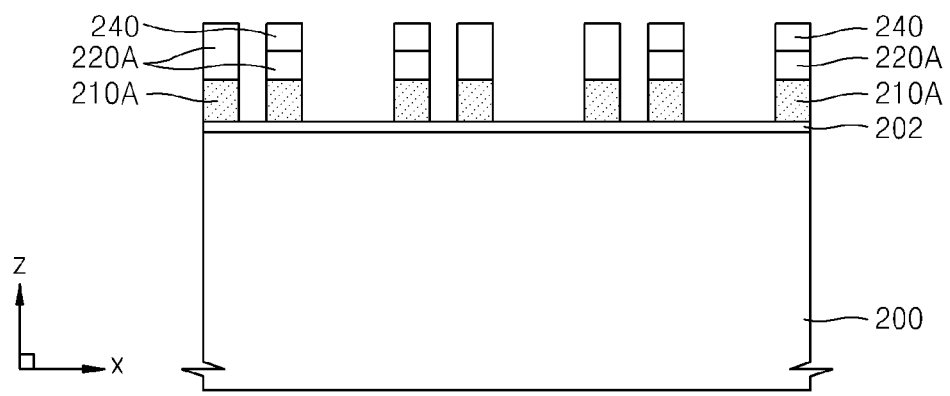

Referring to FIG. 2N, a first hard mask pattern 210A is formed by anisotropically etching the first hard mask layer 210 using the second hard mask pattern 220A and the remnants of the buffer layer 240 as an etch mask. If the trimmed first mask pattern 230B and the trimmed second mask pattern 250B are of the same material as the first hard mask layer 210, the trimmed first mask pattern 230B and the trimmed second mask pattern 250B covering the second hard mask pattern 220A and the remnants of the buffer layer 240 may be removed while the first hard mask layer 210 is etched.

A gas mixture of HBr and $O_2$ may be used as an etching gas to dry etch the first hard mask layer 210. As an example, the HBr and $O_2$ may be supplied at flow rates having a ratio of about 10:1 to about 30:1. Also, He may be added to the etching gas. More specifically, HBr may be supplied at a flow rate of about 100 sccm to about 300 sccm, $O_2$ may be supplied at a flow rate of about 5 sccm to about 30 sccm, and He may be supplied at a flow rate of about 50 sccm to about 200 sccm. If necessary, $Cl_2$ or a gas mixture of HBr and $Cl_2$ may be used instead of HBr. Also, the first hard mask layer 210 may be etched in a plasma atmosphere that is obtained by exciting the etching gas.

Figure 2O:
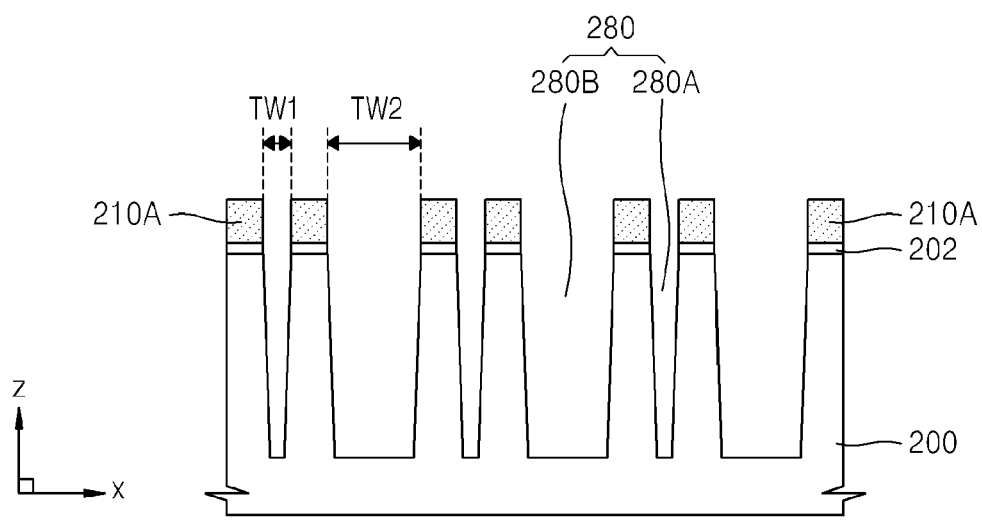

Referring to FIG. 2O, a trench 280 is formed in the substrate 200 by etching the pad oxide layer 202 to expose those portions of a top surface of the substrate 200 spanning the features of the first hard mask pattern 210A, and etching the exposed portions of the substrate 200 using the first hard mask pattern 210A as an etch mask. When viewed from above, the trench 280 may have the same shape as that of the isolation layer 120 (FIG. 1). That is, the shape of the opening in the upper surface of the substrate 200 formed by the trench 280 may be the same as the shape of the isolation layer 120 in horizontal section.

Furthermore, the trench 280 may have first sections 280A and second sections 280B spaced laterally from the first sections, and in which the width of each first section 280A is smaller than the width of each second section 280B. Referring back to FIG. 1, there are two different distances AD1 and AD2 between adjacent active regions 110 of FIG. 1 in the x-axis direction, wherein the distance AD1 is smaller than the distance AD2. The width TW1 of a first section 280A of the trench 280 (the dimension of the first section 280A in the x-axis direction) corresponds to the distance AD1, and the width TW2 of a second section 280B of the trench (the dimension of the second section 280B in the x-axis direction) corresponds to the distance AD2.

Also, as shown in FIG. 2O, the second hard mask pattern 220A and remnants of the buffer layer 240 are not left on the first hard mask pattern 210A of the resultant structure in which the trench 280 is formed. However, if necessary, the second hard mask pattern 220A or both the second hard mask pattern 220A and the remnants of the buffer layer 240 may be left on the first hard mask pattern 210A after the trench 280 is formed.

Figure 2P:
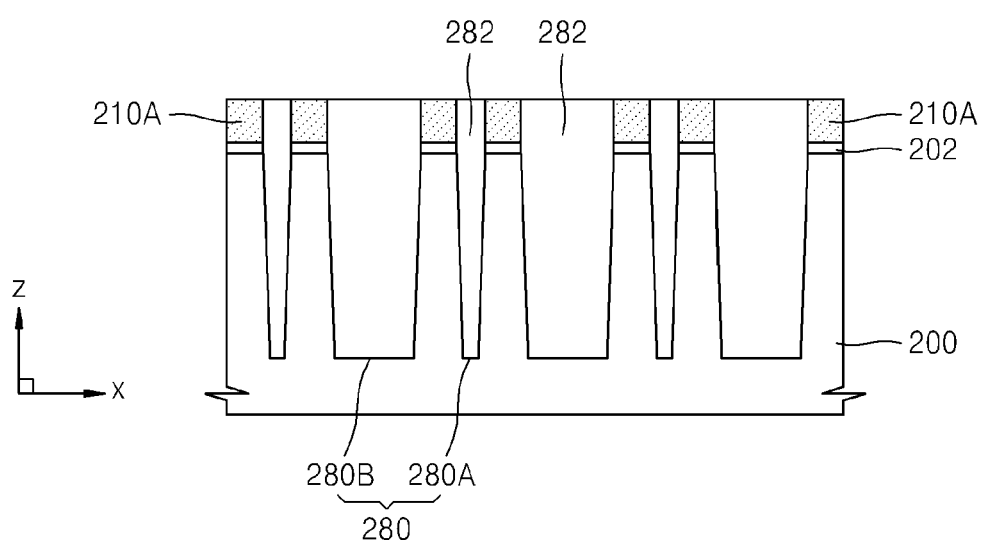

Referring to FIG. 2P, an isolation layer 282 is formed in the trench 280 by depositing an insulating material in the trench 280 and on the first hard mask pattern 210A and planarizing the resultant structure using chemical mechanical polishing (CMP) until the first hard mask pattern 210A is exposed. The isolation layer 282 may correspond to the isolation layer 120 shown in FIG. 1.

The isolation layer 282 may be formed of an insulating material that is different from that from which the first hard mask pattern 210A is formed. For example, the isolation layer 282 may include an oxide layer liner contacting the substrate 200 in the trench 280, and gap-filling insulating material including a nitride filling the remainder of the trench 280. Alternatively, the isolation layer 282 may include an oxide layer liner contacting the substrate 200 in the trench 280, a nitride layer liner formed on the oxide layer liner, and gap-filling insulating material of hydropolysilizane-based inorganic SOG, such as TOSZ, formed on the nitride layer liner and filling the remainder of the trench 280.

Figure 2Q:
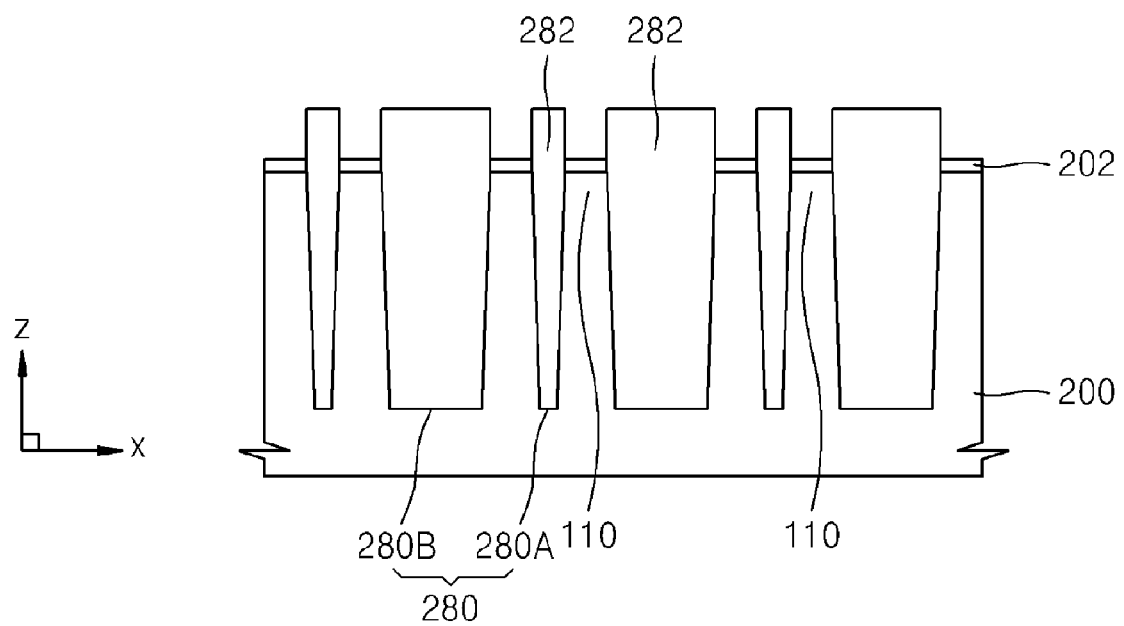

Referring to FIG. 2Q, the first hard mask pattern 210A is removed from the resultant structure including the isolation layer 282. The active regions 110 are defined by the isolation layer 282.

According to the method shown in and described with respect to FIGS. 2A through 2Q, the isolation layer 282 and the first hard mask pattern 210A that are used as an etch mask to form the trench 280 are formed of different materials. Accordingly, the isolation layer 282 can be prevented from being damaged while the first hard mask pattern 210A is removed after the isolation layer 282 is formed. In particular, when the trench 280 needs to have very small dimensions suitable for a highly integrated semiconductor device, a nitride must be used as insulating material for filling the trench 280 because nitrides have good gap-filling properties. To this end, according to an embodiment of the present invention, the gap-filling insulating layer is a nitride layer and the first hard mask pattern 210A is a polysilicon layer. Thus, the isolation layer 282 is not damaged when the hard mask pattern 210A is removed.

Moreover, according to an embodiment of the present invention, the first hard mask pattern 210A used as an etch stop layer during CMP (the process used to form the isolation layer 282) is a polysilicon layer. Accordingly, only polysilicon and oxide layers having a high etch selectivity can be used as etch masks for forming the trench 280. Therefore, the double patterning process of forming the isolation layer 282 for defining the active regions 110 is made relatively simple.

Another method of forming a pattern of a semiconductor device according to the present invention will now be described with reference to FIGS. 3A through 3H. In this regard, the layers/features, etc. shown in and described with respect to the embodiment of FIGS. 3A through 3H and which are similar to those shown in and described with respect to the embodiment FIGS. 2A through 2Q are denoted by the same reference numerals, and the steps/processes used to form such layers/features will not be described in detail. Basically, though, the method of the embodiment of FIGS. 3A through 3H is different from the method of the embodiment of FIGS. 2A through 2Q in that the remnants of the buffer layer 240, instead of the first mask pattern 230A and the second mask pattern 250A, are used as an etch mask to pattern the first hard mask layer 210.

Figure 3A:
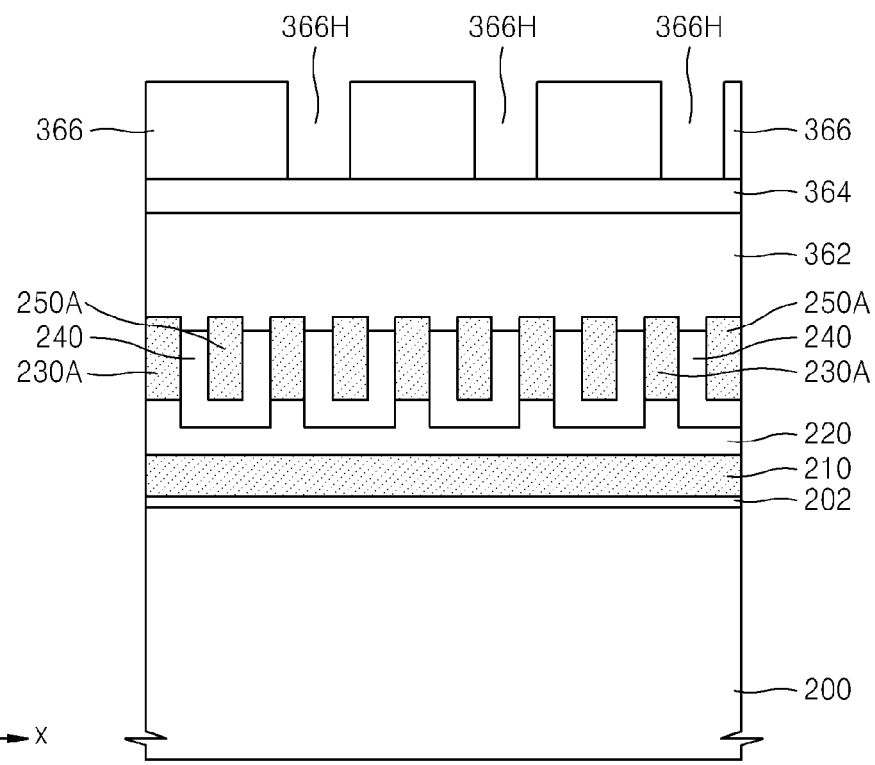
FIGS. 3A through 3H are cross-sectional views illustrating another embodiment of a method of forming a pattern of a semiconductor device according to the inventive present invention.

Referring to FIG. 3A, the first mask pattern 230A and the second mask pattern 250A are formed in such a manner that the remnants of the buffer layer 240 are disposed between the features of the first mask pattern 230A and the features of the second mask pattern 250A as described with reference to FIGS. 2A through 2I.

Next, a trimmed mask pattern is formed on the first mask pattern 230A, the second mask pattern 250A, and the remnants of the buffer layer 240 in a manner similar to that described with reference to FIG. 2J. However, the remnants of the buffer layer 240 are divided by the trimmed mask layer into a plurality of features whose surfaces have the same shapes as those of the active regions 110 (FIG. 1), unlike in the method of FIG. 2J.

In FIG. 3A, a fourth hard mask layer 362, an anti-reflection layer 364, and a photoresist pattern 366 are sequentially formed as the trimmed mask layer to cover the first mask pattern 230A, the second mask pattern 250A, and the remnants of the buffer layer 240. The fourth hard mask layer 362, the anti-reflection layer 364, and the photoresist pattern 366 may be similar to the fourth hard mask layer 262, the anti-reflection layer 264, and the photoresist pattern 266 described with reference to FIG. 2J, respectively. However, the relative positions of the openings 366H defined by the photoresist pattern 366 are different from those of the openings 266H in the photoresist pattern 266 described with reference to FIG. 2J.

Figure 3B:
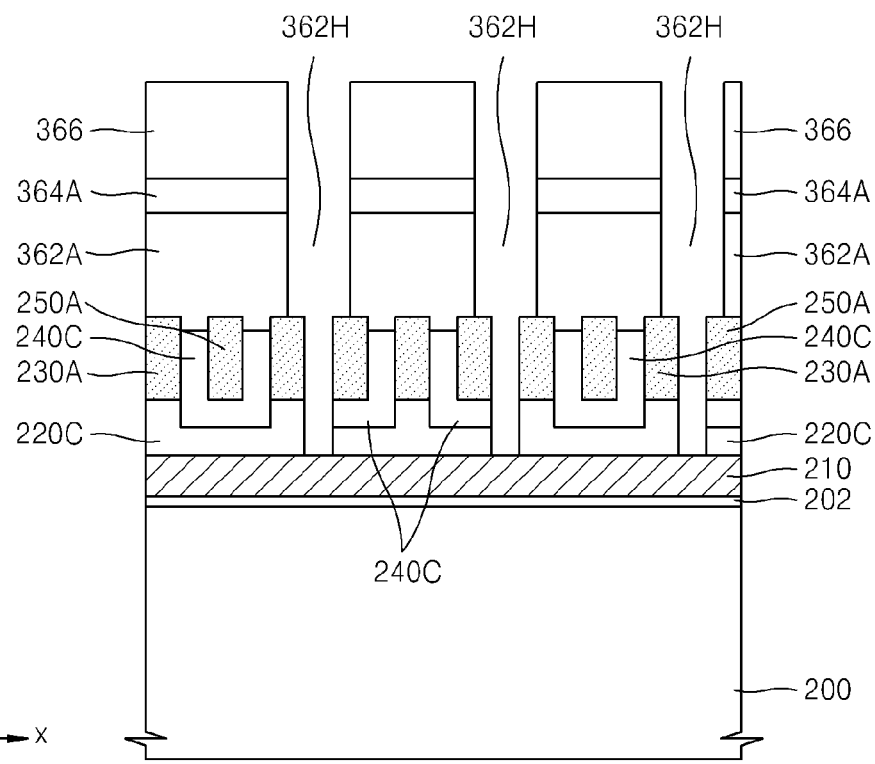

Referring to FIG. 3B, an anti-reflection layer pattern 364A and a fourth hard mask pattern 362A are formed by sequentially etching the anti-reflection layer 364 and the fourth hard mask layer 362 using the photoresist pattern 366 as an etch mask in a manner similar to that described with reference to FIG. 2K. As a result, a plurality of openings 362H are formed between the features of the fourth hard mask pattern 362A. Portions of the remnants of the buffer layer 240 are exposed through the openings 362H formed between the features of the fourth hard mask pattern 362A. If each of the plurality of openings 362H is wide enough, the features of the first mask pattern 230A and the second mask pattern 250A disposed around the exposed portions of the remnants of the buffer layer 240 may also be exposed through the openings 362H.

Also, part of the photoresist pattern 366 may be consumed while the fourth hard mask pattern 362A is formed.

Next, the exposed portions of the remnants of the buffer layer 240 are etched using the fourth hard mask pattern 362A, the first mask pattern 230A, and the second mask pattern 250A as an etch mask. As a result, portions of the second hard mask layer 220 which are exposed. Then the exposed portions of the second hard mask layer 220 are etched. Accordingly, a trimmed buffer layer 240C and a trimmed second hard mask layer 220C are formed on the substrate 200, and portions of the first hard mask layer 210 are exposed through the openings 362H.

Figure 3C:
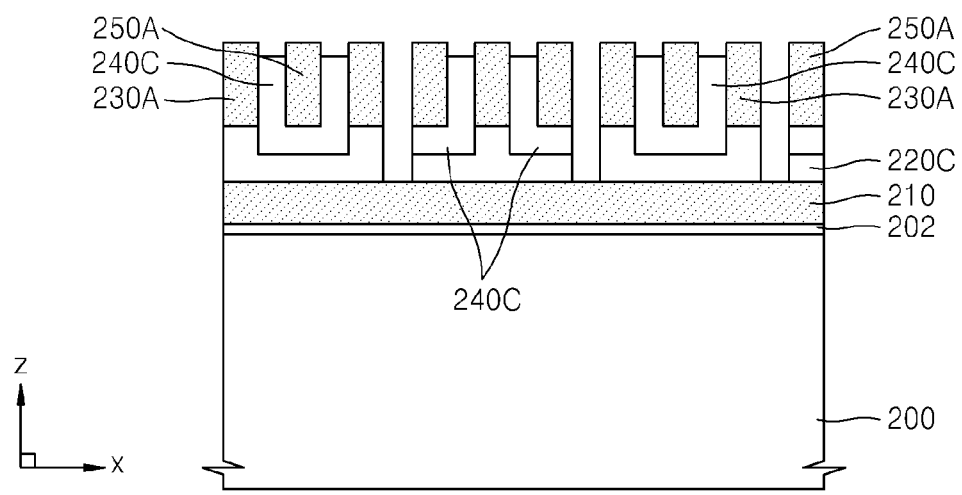

Referring to FIG. 3C, the fourth hard mask pattern 362A, the anti-reflection layer pattern 364A, and the photoresist pattern 366 are removed to expose the top surfaces of the trimmed buffer layer 240C, the first mask pattern 230A, and the second mask pattern 250A.

Figure 3D:
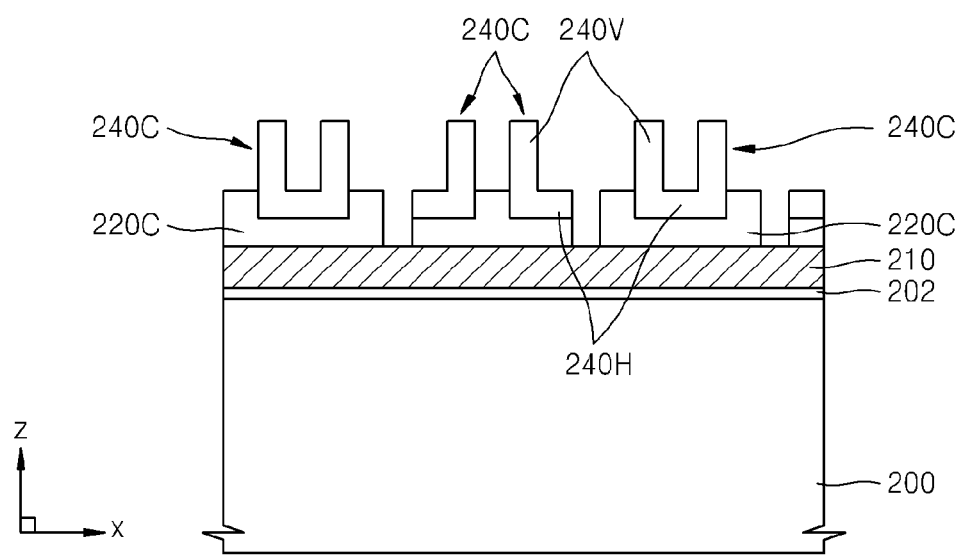

Referring to FIG. 3D, the first mask pattern 230A and the second mask pattern 250A are etched using the trimmed buffer layer 240C as an etch mask.

If the first mask patterns 230A and the second mask pattern 250A are formed of polysilicon, and the trimmed buffer layer 240C and the trimmed second hard mask layer 220C are oxide layers, the first mask pattern 230A and the second mask pattern 250A may be removed by wet etching or dry etching. An etchant containing $NH_4OH$ may be used to wet etch the first mask pattern 230A and the second mask pattern 250A. For example, $NH_4OH$, $H_2O_2$, and $H_2O$ mixed in a volumetric ratio of 4:1:95 may be used as the wet etchant. Alternatively, an etching gas containing $CF_4$ may be used to dry etch the first mask pattern 230A and the second mask pattern 250A. For example, a gas mixture of $CF_4$ and $O_2$, or a gas mixture of $CF_4$, $O_2$, $N_2$, and HF may be used to isotropically chemically dry etch (CDE) the first mask pattern 230A and the second mask pattern 250A.

As a result, a plurality of vertically extending parts 240V and a plurality of horizontally extending parts 240H of the trimmed buffer layer 240C are exposed as shown in FIG. 3D.

Figure 3E:
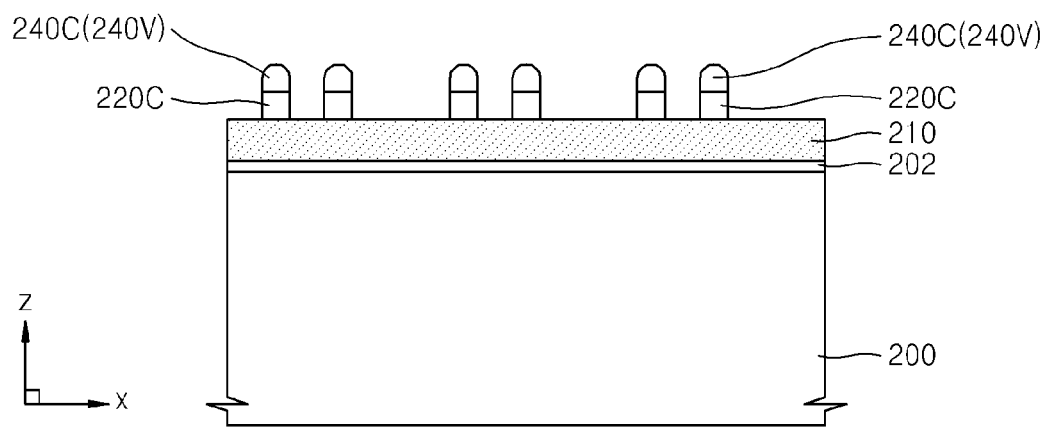

Referring to FIG. 3E, the trimmed second hard mask layer 220C and the horizontally extending parts 240H of the trimmed buffer layer 240C are removed by an anisotropic dry etching process. As a result, the top surface of the first hard mask layer 210 is exposed between the vertically extending parts 240V of the trimmed buffer layer 240C. During this process, the vertically extending parts 240V of the trimmed buffer layer 240C are consumed from the top. Subsequently, a mask of remnants of the trimmed second hard mask layer 220C and remnants of the vertically extending parts 240V of the trimmed buffer layer 240C are left on the first hard mask layer 210.

Figure 3F:
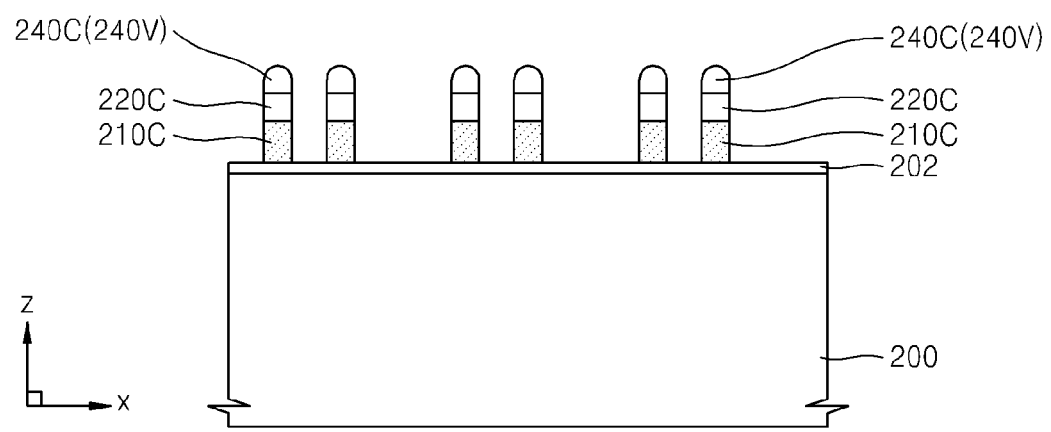

Referring to FIG. 3F, the first hard mask layer 210 is anisotropically dry etched using the aforementioned mask as an etch mask. Thus, a first hard mask pattern 210C is formed.

Figure 3G:
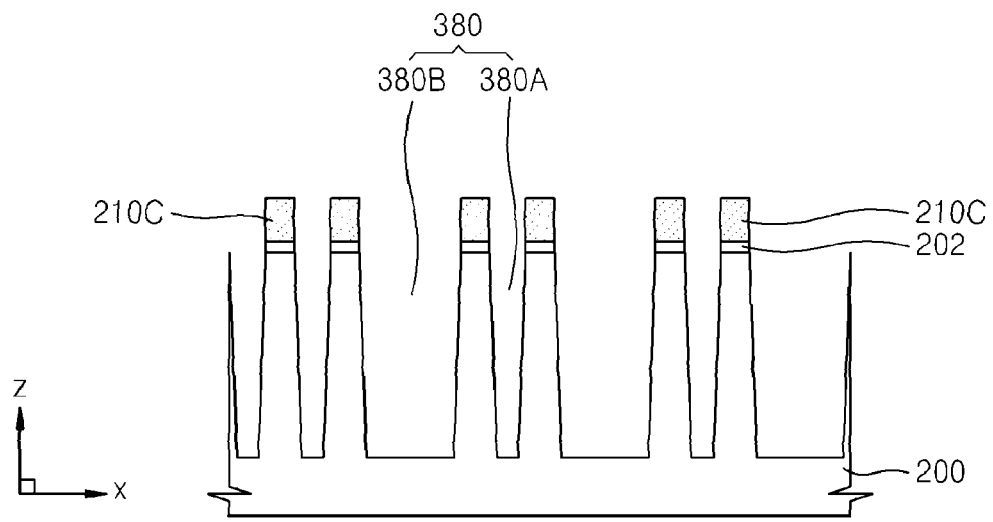

Referring to FIG. 3G, the pad oxide layer 202 is etched to expose the top surface of the substrate 200 between features of the first hard mask pattern 210C, and the exposed portions of the substrate 200 are etched using the first hard mask pattern 210C and the etched pad oxide layer 202 as an etch mask. Accordingly, a trench 380 is formed in the substrate 200. The trench 380 may include a first section 380A, and a second section 380B which is wider than the first section 380A.

Figure 3H:
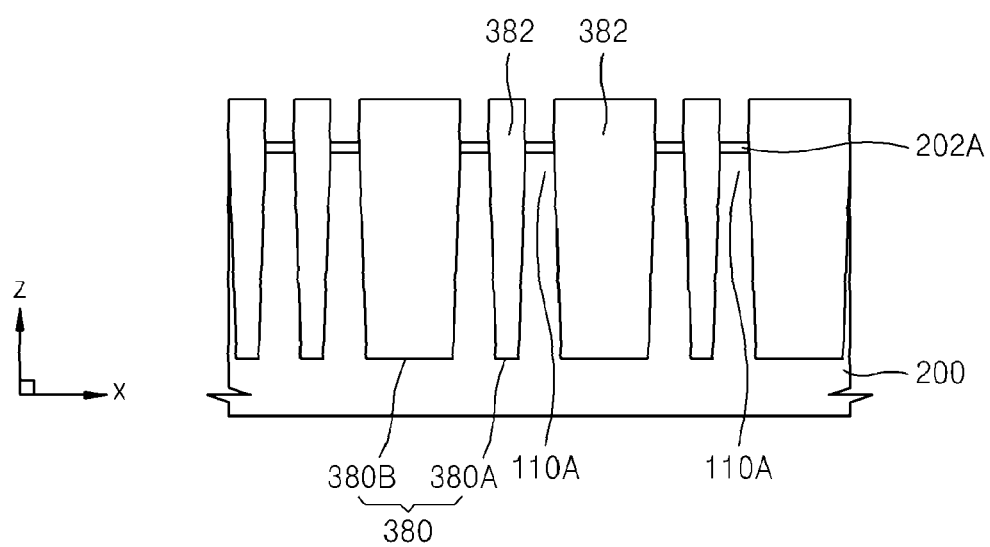

Referring to FIG. 3H, insulating material is deposited in the trench 380 and over the first hard mask pattern 210C. The resultant structure is planarized using CMP until the first hard mask pattern 210C is exposed in the same manner as described with reference to FIG. 2P and FIG. 2Q. The first hard mask pattern 210C is then removed.

As a result, an isolation layer 382 is formed in the trench 380. The active regions 110A are defined on the substrate 200 by the isolation layer 382.

According to the method of FIGS. 3A through 3H, the isolation layer 382 and the first hard mask pattern 210C that are used as an etch mask to form the trench 380 are formed of different materials, and the first hard mask pattern 210C is removed after the isolation layer 382 is formed. Therefore, the device isolation later 382 can be prevented from being damaged. In particular, the insulating layer filling the trench 380 is a nitride layer and the first hard mask pattern 210C is a polysilicon layer. Thus, the isolation layer 382 will not be damaged when the hard mask pattern 210C is removed.

Furthermore, the first hard mask pattern 210C is used as an etch stop during CMP to form the isolation layer 382 is a polysilicon layer, and only polysilicon layers and oxide layers having a high etch selectivity are used as etch masks for forming the trench 380. Therefore, the double patterning technique of forming the isolation layer 382 which defines the active regions 110A is relatively simple.

Finally, although the present invention has been particularly shown and described with reference to the preferred embodiments thereof, it will be understood that various changes in form and details may be made therein without departing from the true spirit and scope of the invention as defined by the following claims.

What is claimed is:

1. A method of forming a pattern of a semiconductor device, the method comprising:
   forming a first hard mask layer on a substrate;
   forming a first mask pattern on the first hard mask layer, the first mask pattern comprising topographic features each having opposite sidewalls;
   forming a buffer layer over the first mask pattern so as to cover both sidewalls of each of the features of first mask pattern;
   forming a second mask pattern of topographic features in such a manner that each of the features of the second mask pattern is disposed between two adjacent ones of each respective pair of the features of the first mask pattern and segments of the buffer layer are interposed between the first and second mask patterns, respectively, wherein the first and second mask patterns and the buffer layer together constitute a masking layer to be trimmed;
   forming a photoresist pattern on a structure constituted by the features of the first and second mask patterns and the segments of the buffer layer, the photoresist pattern having openings disposed over selected portions of the structure;
   subsequently etching the structure to selectively remove the selected portions thereof, thereby trimming the structure and forming openings therethrough that expose the first hard mask layer;
   etching the first hard mask layer using the trimmed structure as an etch mask, to thereby form a first hard mask pattern that exposes portions of the substrate;
   etching the exposed portions of the substrate using the first hard mask pattern as an etch mask to thereby form trenches in the substrate; and
   forming in the trenches an isolation layer of a material that is different from that of the first hard mask pattern.

2. The method of claim 1, wherein the first mask pattern and the second mask pattern are formed of material of the same composition as that of the first hard mask layer.

3. The method of claim 1, wherein the first hard mask pattern and the second mask pattern are formed of polysilicon, and the isolation layer comprises a nitride layer.

4. The method of claim 1, wherein the forming of the first hard mask pattern comprises etching the first hard mask layer using the first mask pattern and the second mask pattern as an etch mask.

5. The method of claim 1, wherein the forming of the first hard mask pattern comprises etching the first hard mask layer using the buffer layer as an etch mask.

6. The method of claim 1, wherein the photoresist pattern is formed such that the openings therethrough are located over selected portions of each of the first mask pattern and the second mask pattern such that the etching of the structure removes the selected portions of each of the first mask pattern and the second mask to thereby form a trimmed first mask pattern and a trimmed second mask pattern comprising remnants of the first mask and second mask patterns, respectively, and the etching of the first hard mask layer is carried out using the trimmed first mask pattern and the trimmed second mask pattern as an etch mask.

7. The method of claim 1, wherein the photoresist pattern is formed such that the openings therethrough are located over selected ones of the segments of the buffer layer such that the etching of the structure removes selected portions of the buffer layer to thereby form a trimmed buffer layer comprising remnants of the buffer layer, and the etching of the first hard mask layer is carried out using the trimmed buffer layer as an etch mask.

8. The method of claim 1, further comprising forming a second hard mask layer, of material having a composition different from that of the material of the first hard mask layer, on the first hard mask layer before the first mask pattern is formed, and forming recesses in a top surface of the second hard mask layer between adjacent ones of the features of the first mask pattern, respectively.

9. The method of claim 8, wherein each of the second hard mask layer and the buffer layer comprises an oxide layer.

10. The method of claim 8, wherein the forming of the buffer layer comprises forming the buffer layer over both opposite sidewalls of adjacent ones of each pair of features of the first mask pattern and over surfaces of the second hard mask layer which delimit bottoms of the recesses in the top surface of the second hard mask layer.

11. The method of claim 6, further comprising forming a second hard mask layer, of material having a composition different from that of the material of the first hard mask layer, on the first hard mask layer before the first mask pattern is formed, and forming recesses in a top surface of the second hard mask layer between adjacent ones of the features of the first mask pattern, respectively.

12. The method of claim 11, wherein each of the second hard mask layer and the buffer layer comprises an oxide layer.

13. The method of claim 11, wherein the forming of the buffer layer comprises forming the buffer layer over both opposite sidewalls of adjacent ones of each pair of features of the first mask pattern and over surfaces of the second hard mask layer which delimit bottoms of the recesses in the top surface of the second hard mask layer.

14. The method of claim 7, further comprising forming a second hard mask layer, of material having a composition different from that of the material of the first hard mask layer, on the first hard mask layer before the first mask pattern is formed, and forming recesses in a top surface of the second hard mask layer between adjacent ones of the features of the first mask pattern, respectively.

15. The method of claim 14, wherein each of the second hard mask layer and the buffer layer comprises an oxide layer.

16. The method of claim 14, wherein the forming of the buffer layer comprises forming the buffer layer over both opposite sidewalls of adjacent ones of each pair of features of the first mask pattern and over surfaces of the second hard mask layer which delimit bottoms of the recesses in the top surface of the second hard mask layer.

* * * * *